United States Patent
Sung

(10) Patent No.: US 10,388,745 B1
(45) Date of Patent: Aug. 20, 2019

(54) STRUCTURE AND METHOD OF FORMING TRANSISTOR DEVICE HAVING IMPROVED GATE CONTACT ARRANGEMENT

(71) Applicant: Varian Semiconductor Equipment Associates, Inc., Gloucester, MA (US)

(72) Inventor: Min Gyu Sung, Essex, MA (US)

(73) Assignee: VARIAN SEMICONDUCTOR EQUIPMENT ASSOCIATES, INC., Gloucester, MA (US)

(*) Notice: Subject to any disclaimer, the term of this patent is extended or adjusted under 35 U.S.C. 154(b) by 0 days.

(21) Appl. No.: 15/928,995

(22) Filed: Mar. 22, 2018

(51) Int. Cl.

| H01L 29/41 | (2006.01) |
|---|---|
| H01L 29/417 | (2006.01) |
| H01L 21/768 | (2006.01) |
| H01L 29/78 | (2006.01) |
| H01L 21/28 | (2006.01) |
| H01L 21/67 | (2006.01) |
| H01L 23/522 | (2006.01) |
| H01L 29/423 | (2006.01) |
| H01L 21/3213 | (2006.01) |

(52) U.S. Cl.
CPC .. *H01L 29/41791* (2013.01); *H01L 21/28114* (2013.01); *H01L 21/32136* (2013.01); *H01L 21/67069* (2013.01); *H01L 21/76804* (2013.01); *H01L 21/76805* (2013.01); *H01L 21/76814* (2013.01); *H01L 23/5226* (2013.01); *H01L 29/41775* (2013.01); *H01L 29/42376* (2013.01); *H01L 29/785* (2013.01)

(58) Field of Classification Search
CPC ......... H01L 29/41791; H01L 21/32136; H01L 23/5226; H01L 21/67069
See application file for complete search history.

(56) References Cited

U.S. PATENT DOCUMENTS

| 9,431,247 | B2* | 8/2016 | Wan | H01L 21/26586 |
|---|---|---|---|---|
| 9,466,722 | B2* | 10/2016 | Liu | H01L 21/823425 |
| 9,570,557 | B2* | 2/2017 | Chou | H01L 21/30604 |
| 9,620,621 | B2* | 4/2017 | Chang | H01L 21/26586 |
| 9,748,364 | B2* | 8/2017 | Sun | H01L 29/66803 |
| 9,853,154 | B2* | 12/2017 | Chang | H01L 29/7848 |
| 10,049,938 | B2* | 8/2018 | Wang | H01L 21/823481 |
| 2005/0191795 | A1* | 9/2005 | Chidambarrao | H01L 29/66795 438/142 |
| 2015/0035061 | A1* | 2/2015 | Yoon | H01L 29/66545 257/365 |
| 2015/0091084 | A1* | 4/2015 | Lee | H01L 29/7806 257/334 |

OTHER PUBLICATIONS

Auth, et al., "A 10nm High Performance and Low-Power CMOS Technology Featuring 3rd Generation FinFET Transistors, Self-Aligned Quad Patterning, Contact over Active Gate and Cobalt Local Interconnects," IEDM17-673-6, 29.1.1-4, © 2017 IEEE.

* cited by examiner

*Primary Examiner* — William Coleman

(57) ABSTRACT

A method may include providing a transistor structure on a substrate, where the transistor structure includes a semiconductor fin, a source/drain contact forming electrical contact with the semiconductor fin, and a gate conductor, disposed over the semiconductor fin, wherein the source drain contact and gate conductor are disposed in a trench. The method may further include directing angled ions to the trench, wherein the source/drain contact assumes a tapered shape.

19 Claims, 6 Drawing Sheets

STRUCTURE AND METHOD OF FORMING TRANSISTOR DEVICE HAVING IMPROVED GATE CONTACT ARRANGEMENT

FIELD

The present embodiments relate to semiconductor device structures, and more particularly, to structures and processing for transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), involves challenging overlay and contact issues. For example, known FinFET based logic design rules do not allow placing gate contact over an active fin region, because an electrical short to source/drain (S/D) may arise. This prohibition in gate contact arrangement incurs a scaling penalty of approximately 10% because of additional area entailed in gate contact placement to avoid the S/D region.

With respect to these and other considerations, the present disclosure is provided.

BRIEF SUMMARY

In various embodiments, device structures and method for forming improved gate contact arrangements are provided. is provided. A method may include providing a transistor structure on a substrate, where the transistor structure includes a semiconductor fin, a source/drain contact forming electrical contact with the semiconductor fin, and a gate conductor, disposed over the semiconductor fin, wherein the source drain contact and gate conductor are disposed in a trench. The method may further include directing angled ions to the trench, wherein the source/drain contact assumes a tapered shape.

In another embodiment, a device structure may include a semiconductor fin and a gate conductor disposed on the semiconductor fin. The device structure may include a pair of source/drain contacts, disposed over the semiconductor fin, the pair of source/drain contacts having a tapered shape, and disposed along a trench structure; and a gate contact, disposed within the trench structure and electrically connected to the gate conductor.

In a further embodiment, a method for forming a finFET device may include providing a transistor structure. The transistor structure may include a semiconductor fin; a pair of source/drain contacts, forming contact with the semiconductor fin; and a gate conductor, disposed over the semiconductor fin, wherein the pair of source drain contacts and gate conductor are disposed in a trench. The method may also include directing angled ions to the trench in a reactive ion etching operation, wherein the pair of source/drain contacts are etched to form a tapered shape; and forming a gate contact in the trench, wherein the gate contact is disposed over the semiconductor fin, and is electrically isolated from the semiconductor fin.

DETAILED DESCRIPTION

Figure 1:
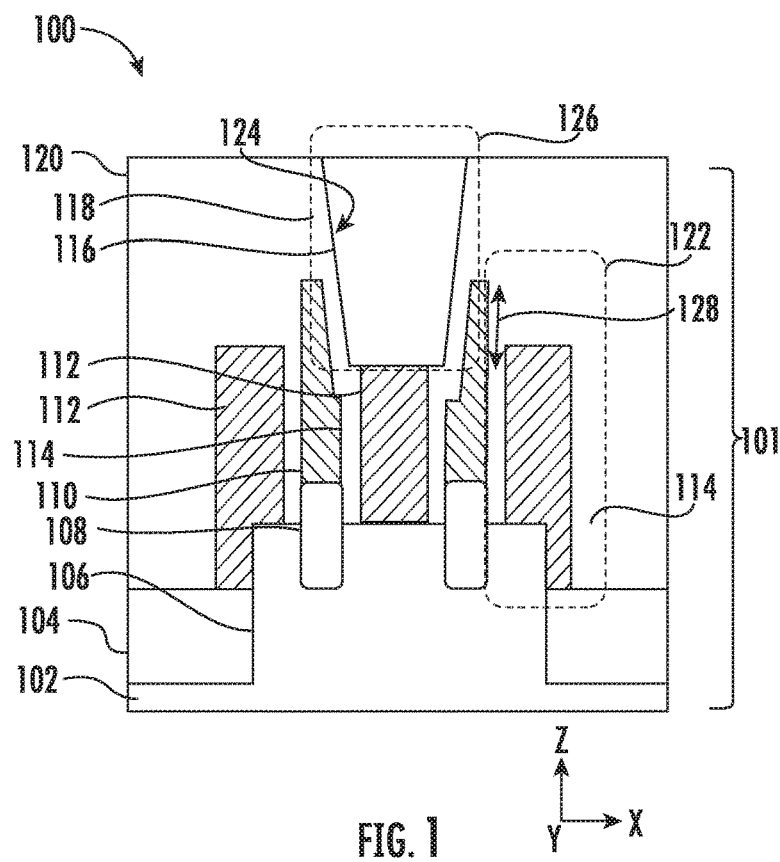
FIG. 1 depicts a side cross-sectional view of a device structure, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Figure 2:
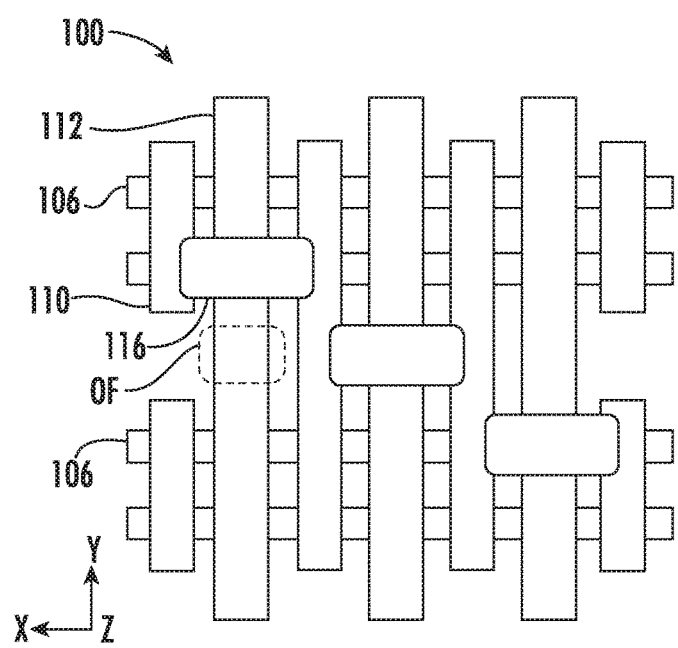
FIG. 2 depicts a top plan view of a device structure, according to embodiments of the disclosure.

Turning now to FIG. 1 and FIG. 2 there is shown a device structure 100, according to embodiments of the disclosure. The device structure 100 is shown in side cross-section in FIG. 1, while one variant of the device structure 100 is shown in top plan view in FIG. 2, as represented by the X-Y plane of the Cartesian coordinate system shown. The device structure 100 is formed in a substrate, where the substrate 101 may include a substrate base 102 and a semiconductor fin 106. The semiconductor fin 106 may be monocrystalline semiconductor material, such as silicon, silicon:germanium alloy, or other semiconductor material. The semiconductor fin 106 may be formed integrally and monolithically with the substrate base 102, as known in the art. The substrate base 102 may be part of a bulk semiconductor substrate, or may be, for example a layer in a silicon-on-insulator substrate.

The device structure 100 may further include a plurality of gate structures, shown as gate structures 122, where a gate structure 122 includes a gate conductor 112, and gate spacer 114. The gate conductor 112 may be formed of known materials, including a semiconductor or metal, such as tungsten or cobalt, and may also include gate dielectric material (not separately shown) positioned on top of semiconductor fin 106. The gate spacer 114 may be an insulator such as silicon nitride in some embodiments. In the example of FIG. 1, the two outer gate structures may be dummy gates, while a central gate structure forms an active gate of a transistor.

As shown in FIG. 1, the gate conductor 112 of the central gate structure is disposed on the semiconductor fin 106, and may act as a transistor gate to control current in the semiconductor fin 106 via a thin gate insulator (not shown for simplicity). As further depicted in FIG. 1, a pair of source/drain contacts, shown as source/drain contacts 110, are disposed over the semiconductor fin 106, to form the additional device contacts of the transistor structure formed by gate conductor 112. The device structure 100 may further include raised source/drain regions 108, formed of semiconductor material, as in known fin FETs, where the source/drain contacts 110 directly contact the raised source/drain regions 108. Advantageously, the source/drain contacts 110 exhibit a tapered shape where the width along the X-axis of the source/drain contact 110 decreases toward the top of the source/drain contact 110. Additionally, a sealing layer 118, such as silicon nitride, is disposed along the trench surfaces 124. As such, the trench surface 124 and sealing layer 118 define a trench structure 126, where the trench structure 126 exhibits a tapered shape, and the sealing layer 118 defines an edge of the trench structure 126. A gate contact 116 is disposed within a trench defined by the trench structure 126, and is electrically connected to the gate conductor 112. In some cases, the gate contact 116 and the gate conductor 112 may be formed of the same material, such as a metal. The embodiments are not limited in this context.

The configuration of the trench structure 126, gate contact 116 and source/drain contacts 110 allows the gate contact 116 to be provided in close proximity to the semiconductor fin 106 and to the source/drain contacts 110. Turning also to FIG. 2, the plan view shows the gate contact 116 is disposed directly over the semiconductor fin 106. This configuration allows more compact design rules, as opposed to known finFET designs where a gate contact may be placed off-fin, as shown in the position OF in FIG. 2. As noted, off-fin placement of a gate contact may lead to a 10% increase in layout area. Notably, the tapered design of the trench structure 126 also allows the gate contact 116 to be disposed at least partially over the source/drain contacts 110, as shown in FIG. 2, while not being electrically shorted to the source/drain contacts 110. In addition, as shown in FIG. 1, the gate contact 116 may vertically overlap the source/drain contacts 110, meaning the gate contact 116 extends within the same plane (parallel to the X-Y plane) as the source/drain contacts 110 for a vertical distance 128 along the Z-axis, while not forming an electrical short between gate and source/drain.

Figure 3A:
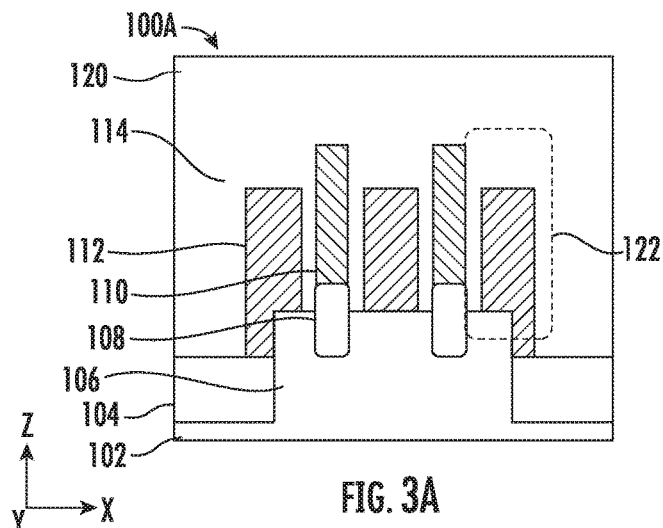
FIGS. 3A-3F show a side cross-sectional view of a device structure, at various stages of fabrication, according to embodiments of the disclosure.

Turning now to FIGS. 3A-3F, there are shown several instances during fabrication of the device structure 100, in accordance with some embodiments of the disclosure. In FIG. 3A there is shown an instance after formation of a transistor structure 100A, precursor to the device structure 100. At this instance, a set of gate structures, shown as gate structures 122, have been formed on the semiconductor fin 106. The source/drain contacts 110 have also been formed over the semiconductor fin 106, and may exhibit a more rectangular shape in cross-section, as shown. The gate structures 122 include one gate structure in the middle, to form an active gate with the semiconductor fin 106. The source/drain contacts 110 extend between gate structures 122 to the top of the gate structures 122, and may be formed according to known processes. At this stage, an interlevel dielectric 120 is disposed over the gate structures 122 and the semiconductor fin 106, and may be silicon oxide in some embodiments. An isolation oxide 104 is also disposed adjacent the semiconductor fin 106, up to a level defining the level for the active portion of the semiconductor fin 106. Raised source/drain regions 108 are also formed on the semiconductor fin 106.

Figure 3B:
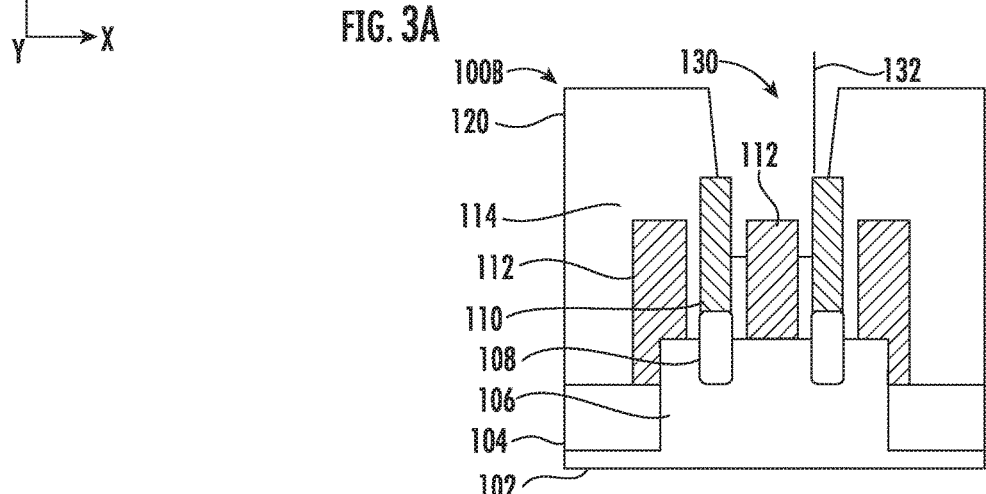

Turning to FIG. 3B, there is shown a subsequent instance, where the structure is shown as transistor structure 100B, after the formation of a trench 130 in the interlevel dielectric 120, where the gate conductor 112 and source/drain contacts are now disposed in the trench 130 and are exposed. The trench 130 may be formed according to known lithographic and etch processing and may be formed using a reactive ion etching (RIE) process or chemical etching process tailored for selectively etching silicon oxide or other material of the interlevel dielectric 120 over the material of the gate conductor 112 and source/drain contacts 110. The sidewalls of the trench 130 may be close to vertical, or may form a non-zero angle of inclination with respect to a perpendicular 132 to the substrate plane, meaning the X-Y plane. In various embodiments, the angle of inclination may be 2 degrees or 3 degrees with respect to the perpendicular, meaning approximately 87 degrees or 88 degrees with respect to the X-Y plane.

Figure 3C:
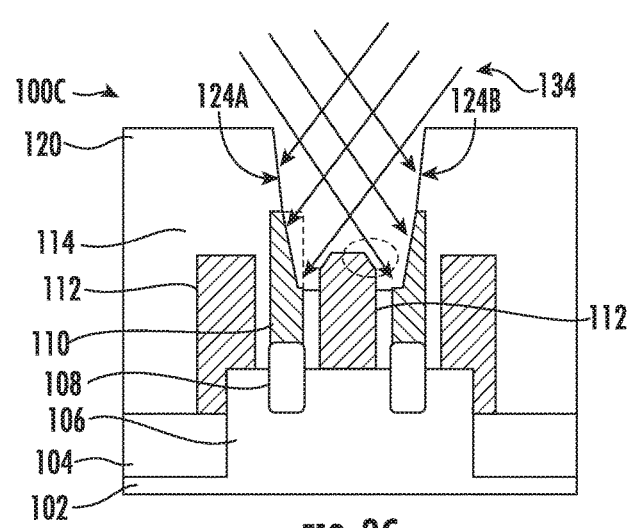

Turning to FIG. 3C, there is shown a subsequent instance where the structure is shown as transistor structure 100C. At this instance, angled ions 134 are directed to the trench 130, where the trajectories of angled ions 134 are incident at a non-zero angle of incidence, and less than ninety degrees, with respect to a substrate plane, represented by the X-Y plane. Thus, the angled ions 134 also form a non-zero angle with respect to the perpendicular 132. The angled ions 134 may be provided in a reactive ion etching process, where material of the source/drain contacts 110 and material of the gate conductor 112 is etched, in some cases, etched selectively with respect to the interlevel dielectric 120 and gate spacer 114. For example, the gate conductor 112 and source/drain contacts 110 may be composed of a metal such as cobalt or tungsten, where the reactive ion etching process selectively etches such a metal with respect to silicon oxide or silicon nitride. As a result of the etching using angled ions 134, the source/drain contacts 110 may assume a tapered shape, as discussed above with respect to FIG. 1. In some embodiments, the angled ions 134 may also cause the gate conductor 112 to develop a beveled shape, as shown. The tapered and beveled shapes developed by the angled ions 134 may aid in proper formation and electrical isolation of a gate contact from the source/drain contacts 110, described below. As also shown in FIG. 3C, the source/drain contacts 110 may retain their initial height after exposure to the angled ions 134. Said differently, just the upper inner corners (shown in the dashed line) of the source/drain contacts 110 may be etched during exposure to the angled ions 134, leaving the majority of the material of the source/drain contracts 110 intact.

Figure 3D:
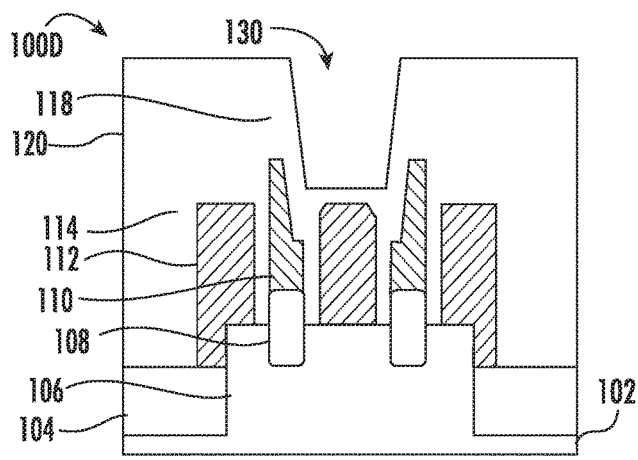

Turning to FIG. 3D, there is shown the transistor structure 100D, representing the device structure at a subsequent instance after the depositing of a sealing layer 118 over the source/drain contacts 110 and the gate conductor 112. The sealing layer 118 may be a silicon nitride layer or other suitable insulator material. The sealing layer 118 may electrically isolate the gate conductor 112 from the source/drain contacts 110. The sealing layer 118 may be deposited in any convenient process, such as a blanket deposition, providing conformal or semi-conformal coverage. Because the exposed sidewalls of the source/drain contacts (see FIG. 3C) are tapered and the gate conductor 112 in the trench 130 is beveled before depositing the sealing layer 118, the sealing layer 118 may readily coat the source/drain contacts 110, the gate conductor 112 and regions between source/drain contacts 110 and gate conductor 112.

Figure 3E:
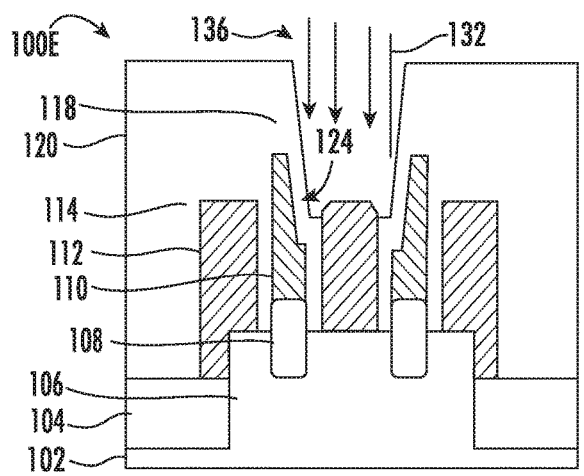

Turning to FIG. 3E, there is shown the transistor structure 100E, representing the device structure at a subsequent instance after the etching of sealing layer 118 using etchant 136. The etching of the sealing layer 118 may be accomplished by anisotropic etching such as in a RIE process, where the etchant 136 represents directional ions, aligned along the Z-axis. The inclination of the trench surface 124 may be close to vertical, meaning the angle formed by the trench surface 124 with respect to perpendicular 132 may be 3 degrees or less in some embodiments. As such, little etching of the sealing layer 118 may take place along the trench surface 124 when subject to anisotropic etching, so the source/drain contacts 110 remain covered by the sealing layer 118, as shown. The etching endpoint may be determined, for example, by determining when the gate conductor is exposed, which event happens before source/drain contacts are exposed.

Figure 3F:
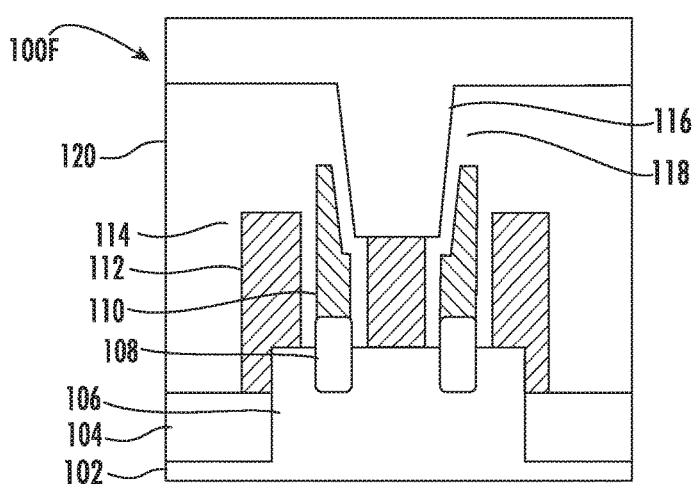

Turning to FIG. 3F, there is shown the transistor structure 100F, representing the device structure after a subsequent deposition of a gate contact 116, where the gate contact 116 may be deposited by any appropriate deposition process, such as a blanket chemical vapor deposition process or physical vapor deposition process. The embodiments are not limited in this context. The gate contact layer used to form the gate contact 116 may subsequently by polished by a chemical mechanical polishing operation to planarize the structure as shown in FIG. 1.

Figure 4:
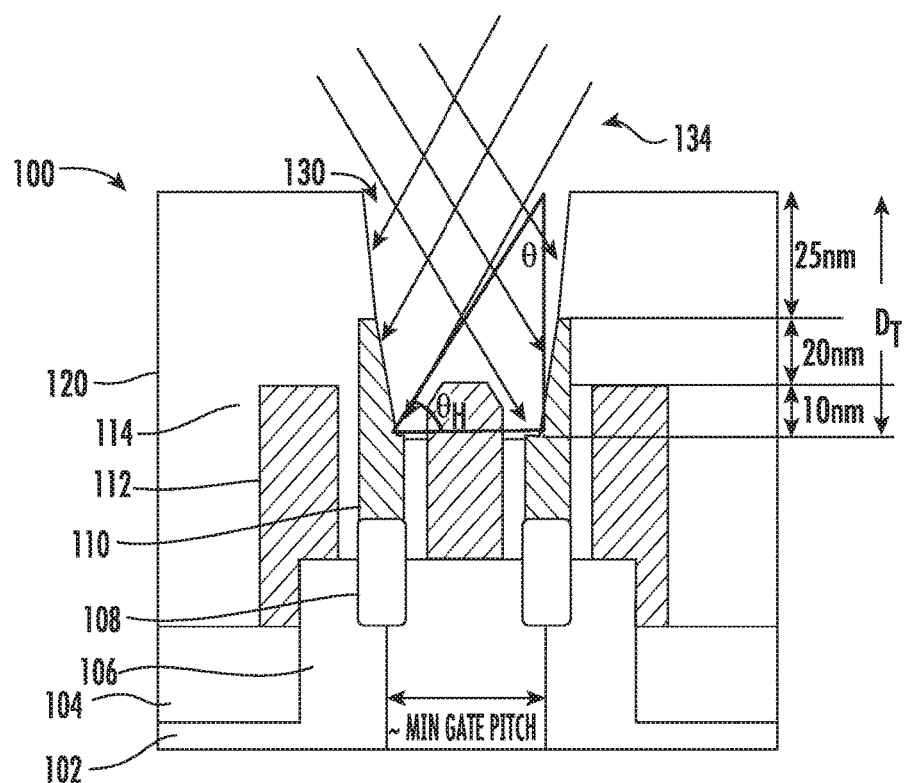
FIG. 4 shows a schematic depiction of exemplary geometry for processing of a device structure.

Turning also to FIG. 4, there is shown a schematic depiction of the device structure 100, illustrating the geometry for etching the source/drain contacts 110. In the device structure 100, processing using angled ions 134 has proceeded to a point as represented by FIG. 3C, discussed above. The trench 130 has a trench depth shown as $D_T$, and a trench width, $W_T$, where the trench width may be approximately the gate pitch as shown. The trench depth may equal the depth of the exposed part of the gate conductor 112, plus the thickness of the gate capping nitride, plus the thickness of interlevel dielectric 120. In one example, the trench depth may equal 55 nm as shown for the exemplary dimensions of FIG. 4. The angle of incidence of the angled ions 134 with respect to a substrate plane (X-Y plane) is shown as $\theta_H$, where this angle may be determined based upon the shadowing of angled ions 134 provided by the trench 130. To provide ions reaching the bottom of the trench 130, the triangle of FIG. 4 defines the needed angle, where the tangent of the angle is simply the trench depth divided by the trench width, or $$\text{Tan } \theta_H = (D_T)/(D_W).$$

Table I provides some examples of $\theta_H$ for different technology nodes, where a constant trench depth of 55 nm is assumed and the fin pitch for different technology nodes is as shown. These examples are merely exemplary, meant to illustrate the general principle for determining the angle for angled ions to etch exposed source/drain contacts and gate conductor at the bottom of a trench. As shown in table I. the angle of angled ions may range between approximately 39 degrees and 52 degrees for advanced finFET technology nodes.

Gate pitch
10 nm tech=68 nm
7 nm tech=54 nm
5 nm tech=42 nm $\theta_H$=arc tan(55 nm/min gate pitch)

RIE angle, $\theta_H$
68 nm gate pitch=39°
54 nm gate pitch=45°
42 nm gate pitch=52°

Table I. Angle of Incidence for Angled Ions for Different finFET Technologies

Figure 5C:
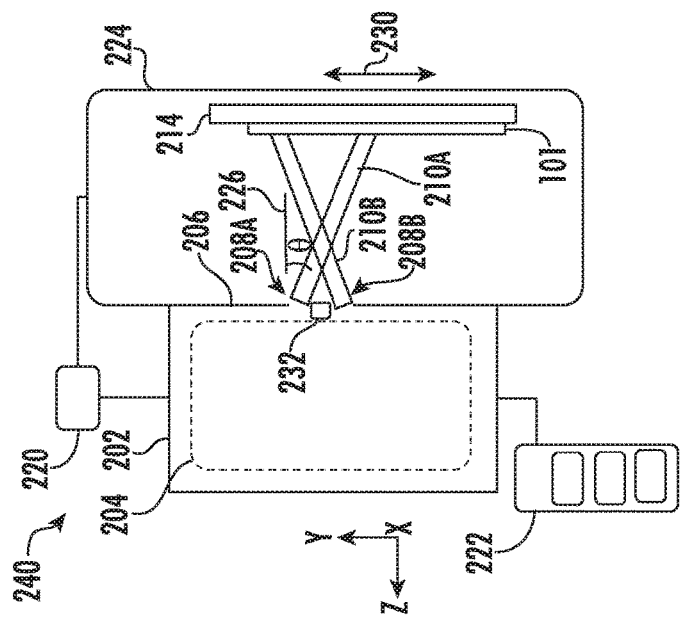
FIG. 5C shows another processing apparatus, depicted in schematic form, in accordance with embodiments of the disclosure.
Figure 5A:
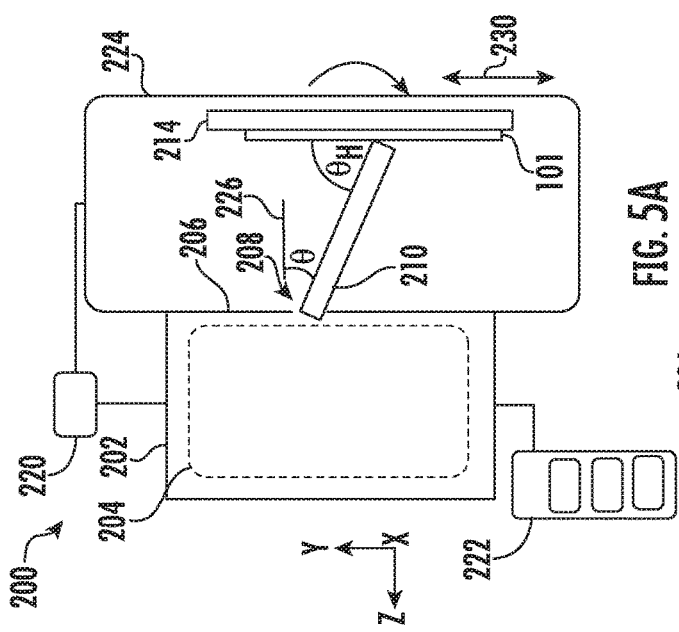
FIG. 5A shows a processing apparatus, depicted in schematic form, in accordance with embodiments of the disclosure.

In various embodiments of the disclosure, the angled ions 134 used as outlined above may be provided as an ion beam, such as from a compact plasma-based apparatus. Turning now to FIG. 5A, there is shown a processing apparatus 200, depicted in schematic form. The processing apparatus 200 represents a processing apparatus for performing angled ion treatment of a substrate, such as for reactive angled ion beam etching of a substrate. Different than many common reactive ion etching (RIE) the reactive angled ion beam etching may direct ions in a reactive ion etching environment at a controlled, non-zero angle of incidence with respect to a perpendicular to a substrate plane. This geometry facilitates directing ions to select portions of substrate structures, for instance. The processing apparatus 200 may be a plasma based processing system having a plasma chamber 202 for generating a plasma 204 therein by any convenient method as known in the art. An extraction plate 206 may be provided as shown, having an extraction aperture 208, where an angled ion beam 210 may be extracted to provide angled ions to a substrate 101, where the angled ions fulfill the etching role of angled ions 134, described above. The substrate 101, including, for example, the aforementioned substrate base 102 and transistor structure, is disposed in the process chamber 224. A substrate plane of the substrate 101 is represented by the X-Y plane of the Cartesian coordinate system shown, while a perpendicular to the plane of substrate lies along the Z-axis (Z-direction).

As further shown in FIG. 5A, the angled ion beam 210 may be extracted when a voltage difference is applied using bias supply 220 between the plasma chamber 202 and substrate 101, or substrate platen 214, as in known systems. The bias supply 220 may be coupled to the process chamber 224, for example, where the process chamber 224 and substrate 101 are held at the same potential.

According to various embodiments, the angled ion beam 210 may be extracted at a non-zero angle of incidence, shown as θ, with respect to the perpendicular 226. A pictorial representation of θ is also shown in FIG. 4, showing θ is the complementary angle to $\theta_H$. Thus, if $\theta_H$ is 52 degrees, θ is 38 degrees. The trajectories of ions within the angled ion beam 210 may be mutually parallel to one another or may lie within a narrow angular range, such as within 10 degrees of one another or less. Thus, the value of θ may represent an average value of incidence angle where the individually trajectories vary up to several degrees from the average value. According to various embodiments, the value of θ (and accordingly also $\theta_H$) may be adjusted by varying the width of the extraction aperture 208 along the Y-axis, by changing applied power to plasma chamber 202, by changing the separation between extraction plate 206 and substrate platen 214, among other features. In various embodiments, the angled ion beam 210 may be extracted as a continuous beam or as a pulsed ion beam as in known systems. For example, the bias supply 220 may be configured to supply a voltage difference between plasma chamber 202 and process chamber 224, as a pulsed DC voltage, where the voltage, pulse frequency, and duty cycle of the pulsed voltage may be independently adjusted from one another.

In various embodiments, reactive gas, such as known gas or gases used for reactive ion etching, may be supplied by the source 222 to plasma chamber 202. The plasma 204 may generate various reactive species, depending upon the exact composition of species provided to the plasma chamber 202. The source 222 may represent a manifold and a plurality of gas sources in some embodiments, where a different gas source is chosen according to the material to be etched.

Figure 5B:
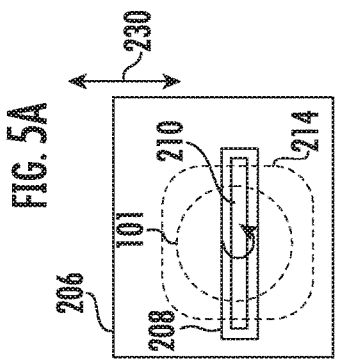
FIG. 5B depicts a face view of an extraction arrangement for the processing apparatus of FIG. 5A.

In various embodiments, the angled ion beam 210 may be provided as a ribbon ion beam having a long axis extending along the X-direction of the Cartesian coordinate system shown in the top plan view of FIG. 5B. By scanning a substrate platen 214 including substrate 101 with respect to the extraction aperture 208, and thus with respect to the angled ion beam 210 along the scan direction 230, the angled ion beam 210 may treat different portions of the substrate 101.

In this example of FIG. 5B, the angled ion beam 210 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. A ratio of beam width to beam length may be in the range 5/1, 10/1, 20/1 50/1, or 100/1. The embodiments are not limited in this context.

Notably, the scan direction 230 may represent the scanning of substrate 101 in two opposing (180 degrees) directions along the Y-direction, or just a scan toward the left or a scan toward the right. As shown in FIG. 5B, the long axis of angled ion beam 210 extends along the X-direction, perpendicularly to the scan direction 230. Accordingly, an entirety of the substrate 101 may be exposed to the angled ion beam 210 when scanning of the substrate 101 takes place along a scan direction 230 to an adequate length from a left side to right side of substrate 101, as shown in FIG. 2B.

Referring also to FIG. 3C, in accordance with various embodiments of the disclosure, angled ions may be provided to a first sidewall 124A and a second sidewall 124B by rotating the substrate platen 214 through a twist angle φ of 180 degrees about the perpendicular 226 between two different exposures. Said differently, the different sidewalls forming the trench surface 124 may be subject to a first exposure to the angled ions when the substrate is in a first rotational position. The substrate may then be rotated 180 degrees about the perpendicular to a second rotational position, and provided with a second exposure to the angled ions wherein the substrate is in the second rotational position.

In other embodiments of the disclosure, a modified apparatus may be used to provide simultaneous exposure of the first sidewall 124A and the second sidewall 124B to angled ions. Turning now to FIG. 5C, there is shown another processing apparatus 240, depicted in schematic form. The processing apparatus 240 represents a processing apparatus for performing angled ion treatment of a substrate, and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly. When configured in the shape of a ribbon beam as in FIG. 5B, these angled ion beams may expose an entirety of the substrate 101 to reactive ion etching of sidewall material by scanning the substrate platen 214 as shown.

Figure 6:
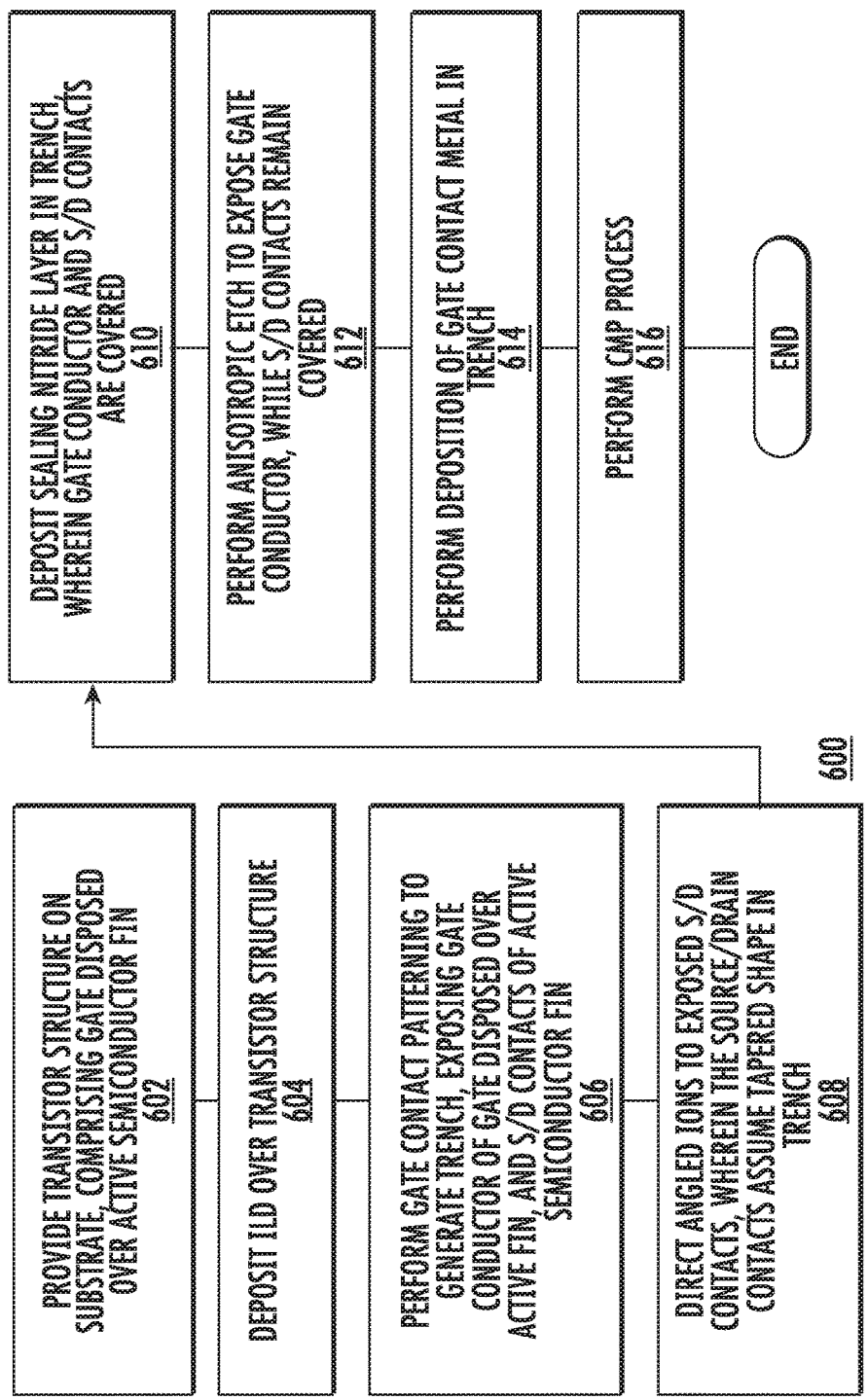
FIG. 6 shows an exemplary process flow, according to further embodiments of the disclosure.

FIG. 6 depicts an exemplary process flow 600, according to embodiments of the disclosure. At block 602, a transistor structure is provided. The transistor structure may include a gate, disposed over an active semiconductor fin. The gate may include a gate conductor and gate liner, as well as a gate insulator or gate oxide between the gate conductor and semiconductor fin. In some embodiments, the active semiconductor fin may be monocrystalline silicon. In some embodiments, the transistor structure may include a set of gate structures including dummy gates. The transistor structure may further include an isolation layer, such as shallow trench isolation (STI) material, where a portion of the active semiconductor fin to define an active device extends above the top of the isolation layer.

At block 604, an interlevel dielectric (ILD) layer is deposited over the transistor structure. The ILD may be a known material, such as an oxide. The ILD may be planarized to define a given thickness above the tops of gates of the transistor device.

At block 606, gate contact patterning is performed to generate a trench in the ILD layer, where the trench exposes the gate conductor and a pair of source/drain contacts previously formed in contact with the semiconductor fin.

At block 608, angled ions are directed to the exposed source/drain contacts in the trench, generating a tapered shape in the source/drain contacts. In some embodiments, the angled ions may be part of a reactive ion etching mixture, where the angled ions selectively etch the source/drain contacts with respect to the interlevel dielectric material. The angled ions may also etch the gate conductor, generating a beveled structure in the gate conductor.

At block 610, a sealing layer, such as a sealing nitride layer, is deposited in the trench, where the gate conductor and source/drain contacts are covered by the sealing nitride layer. As such, the gate conductor may be electrically isolated from the source/drain contacts.

At block 612 an anisotropic etch is performed to expose the gate conductor, while the source/drain contacts remain covered by the sealing nitride layer.

At block 614, a gate contact is deposited in the trench, forming electrical contact with the gate conductor. In some embodiments, the gate contact and gate conductor may be the same material, such as a metal.

At block 616, a chemical mechanical polish operation is performed to planarize the transistor structure, removing excess gate contact material.

The present embodiments provide various advantages over known device structures. For one advantage, the source/drain contact device structure allows a gate contact to be formed over an active semiconductor fin, improving layout density for finFET type devices. For another advantage, the tapered source/drain contact device structure may also allow a gate contact to extend over source/drain contacts while not shorting between gate and source/drain contacts. For a further advantage, the tapered source/drain contact device structure allows the majority of a source/drain contact to be preserved, so an undue increase in resistance due to loss of source/drain contact metal is avoided. Other advantages afforded by the present embodiments include the easier wiring schemes for back-end-ofline wiring, facilitated when the source/drain contact can pass over gate contact, as well as the ability to stagger gate contacts so there is less chance of shorting between gate contacts.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming a semiconductor device, comprising
   providing a transistor structure on a substrate, the transistor structure comprising:
      a semiconductor fin;
      a source/drain contact forming electrical contact with the semiconductor fin; and
      a gate conductor, disposed over the semiconductor fin, wherein the source/drain contact and gate conductor are disposed in a trench, the trench being disposed above the semiconductor fin and separate from the semiconductor fin; and
   directing angled ions to the trench, wherein the source/drain contact assumes a tapered shape.

2. The method of claim 1, wherein the source/drain contact retains an initial height after the directing the angled ions.

3. The method of claim 1, comprising
   depositing a sealing layer over the source/drain contact and the gate conductor after the directing the angled ions;
   performing an anisotropic etch of the sealing layer to expose gate conductor, while the source/drain contact remains covered by the sealing layer; and
   forming a gate contact in the trench, wherein the gate contact is disposed over the source/drain, and is electrically isolated from the semiconductor fin.

4. The method of claim 1, wherein the source/drain contact does not have the tapered shape before the directing the angled ions.

5. The method of claim 1, wherein the gate conductor assumes a beveled shape after the directing the angled ions.

6. The method of claim 1, comprising directing the angled ions as an ion beam having a shape of a ribbon beam to the substrate, the ion beam defining a trajectory forming a non-zero angle of incidence with respect to a perpendicular to a plane of the substrate.

7. The method of claim 1, wherein the trench comprises a trench depth, $D_T$, and a trench width, $W_T$, wherein the directing the angled ions comprises directing the angled ions at a non-zero angle of incidence with respect to a substrate plane, wherein:

$$\tan \theta_H = (D_T)/(D_W).$$

8. The method of claim 3, wherein the trench is formed in an interlevel dielectric, comprising an oxide, and wherein the sealing layer is a nitride.

9. The method of claim 3, wherein the gate contact vertically overlaps the source/drain contact.

10. The method of claim 6, wherein the directing the angled ions comprises:
    providing a first exposure to the angled ions when the substrate is in a first rotational position;
    rotating the substrate through 180 degrees about the perpendicular to a second rotational position; and
    providing a second exposure to the angled ions wherein the substrate is in the second rotational position.

11. A device structure, comprising:
    a semiconductor fin;
    a gate conductor disposed on the semiconductor fin;
    a pair of source/drain contacts, disposed over the semiconductor fin, the pair of source/drain contacts having a tapered shape, and disposed along a trench structure, the trench structure being disposed above the semiconductor fin and separate from the semiconductor fin; and
    a gate contact, disposed within the trench structure and electrically connected to the gate conductor.

12. The device structure of claim 11, wherein the gate contact is disposed over the semiconductor fin and disposed at least partially over the pair of source/drain contacts.

13. The device structure of claim 11, further comprising a sealing layer, defining an edge of the trench structure, and electrically isolating the gate contact from the pair of source/drain contacts.

14. The device structure of claim 11, wherein the gate contact vertically overlaps the pair of source/drain contacts.

15. The device structure of claim 11, wherein the trench structure is disposed in an interlevel dielectric.

16. A method for forming a finFET device, comprising
    providing a transistor structure, the transistor structure comprising:
       a semiconductor fin;
       a pair of source/drain contacts, forming contact with the semiconductor fin;
       a gate conductor, disposed over the semiconductor fin, wherein the pair of source drain contacts and gate conductor are disposed in a trench;
    directing angled ions to the trench in a reactive ion etching operation, wherein the pair of source/drain contacts are etched to form a tapered shape; and
    forming a gate contact in the trench, wherein the gate contact is disposed over the semiconductor fin, and is electrically isolated from the semiconductor fin.

17. The method of claim 16, wherein the gate contact vertically overlaps the source/drain contact.

18. The method of claim 16, wherein the source/drain contact does not have the tapered shape before the directing the angled ions.

19. The method of claim 16, wherein the gate conductor assumes a beveled shape after the directing the angled ions.

* * * * *